(12) United States Patent
Jeon

(10) Patent No.: US 9,362,158 B2
(45) Date of Patent: Jun. 7, 2016

(54) OTP MEMORY CELL AND FABRICATING METHOD THEREOF

(71) Applicant: Magnachip Semiconductor, Ltd., Cheongju-si (KR)

(72) Inventor: Seong-do Jeon, Cheongju-si (KR)

(73) Assignee: MAGNACHIP SEMICONDUCTOR, LTD., Cheongju-si (KR)

( * ) Notice: Subject to any disclaimer, the term of this patent is extended or adjusted under 35 U.S.C. 154(b) by 0 days.

(21) Appl. No.: 14/949,066

(22) Filed: Nov. 23, 2015

(65) Prior Publication Data

US 2016/0079113 A1    Mar. 17, 2016

Related U.S. Application Data

(62) Division of application No. 13/715,119, filed on Dec. 14, 2012, now Pat. No. 9,263,450.

(30) Foreign Application Priority Data

Aug. 2, 2012  (KR) .................. 10-2012-0084862

(51) Int. Cl.
| | |
|---|---|
| *H01L 21/762* | (2006.01) |
| *H01L 27/112* | (2006.01) |
| *G11C 17/16* | (2006.01) |
| *H01L 29/423* | (2006.01) |

(52) U.S. Cl.
CPC .... *H01L 21/76224* (2013.01); *H01L 27/11206* (2013.01); *H01L 29/4238* (2013.01); *H01L 29/42368* (2013.01); *G11C 17/16* (2013.01)

(58) Field of Classification Search
CPC ................... H01L 27/11206; H01L 29/42368; H01L 29/4238; G11C 17/16
See application file for complete search history.

(56) References Cited

U.S. PATENT DOCUMENTS

| | | | |
|---|---|---|---|
| 7,553,704 B2 | 6/2009 | Min et al. | |
| 2006/0292754 A1* | 12/2006 | Min ..................... | H01L 23/5252 438/131 |
| 2009/0206381 A1* | 8/2009 | Shin ..................... | H01L 23/5254 257/300 |
| 2009/0283814 A1* | 11/2009 | Chen ..................... | G11C 17/16 257/318 |
| 2014/0035014 A1 | 2/2014 | Jeon | |

\* cited by examiner

*Primary Examiner* — Raj R Gupta
(74) *Attorney, Agent, or Firm* — NSIP Law

(57) ABSTRACT

A one-time programmable (OTP) memory cell is provided, which includes: a well of a first conductivity type; a gate insulating layer formed on the well and including first and second fuse regions; a gate electrode of a second conductivity type formed on the gate insulating layer, the second conductivity type being opposite in electric charge to the first conductivity type; a junction region of the second conductivity type formed in the well and arranged to surround the first and second fuse regions; and an isolation layer formed in the well between the first fuse region and the second fuse region.

5 Claims, 24 Drawing Sheets

US 9,362,158 B2

OTP MEMORY CELL AND FABRICATING METHOD THEREOF

CROSS-REFERENCE TO RELATED APPLICATION(S)

This application is a Divisional of U.S. patent application Ser. No. 13/715,119 filed Dec. 14, 2012, which claims the benefit under 35 U.S.C. §119(a) to Korean Patent Application No. 10-2012-0084862 filed on Aug. 2, 2012, in the Korean Intellectual Property Office, the entire disclosure of which is incorporated herein by reference for all purposes.

BACKGROUND

1. Field

The following description relates to an OTP memory cell and a fabricating method thereof, and such as, for example, to an anti-fuse OTP memory cell and a fabricating method thereof.

2. Description of Related Art

A one-time-programmable (OTP) memory device is a type of nonvolatile memory device in which programming is possible only once on a circuit.

Various types of OTP memory devices have been developed. Among them, a unit cell of an anti-fuse OTP memory device generally includes a well formed in a semiconductor substrate, a gate insulating layer formed on the well and including at least one fuse region, a gate electrode formed on the gate insulating layer, and a junction region, such as a source region and a drain region, formed in the well.

The one-time programming is accomplished by applying a write voltage to the gate electrode, which causes the insulation state of the fuse region to be blown. Then, the fuse region of the gate insulating layer and the junction region adjacent to the fuse region act as resistors that have resistance values of a predetermined range.

However, after being blown, the fuse region may have a resistance value that exceeds a predetermined range. This corresponds to a blowing failure. To improve the yield thereof, an anti-fuse type memory device may be provided with two fuses in the unit cell. In such an anti-fuse type memory device, if any one of the two fuse regions is blown, a write voltage that is applied to the other fuse region may drop, causing a blowing failure. If the fuse region blown first results in a blowing failure, both of the fuse regions fail in blowing, causing an error during a read operation.

On the other hand, it is ideal that blowing occurs in an edge portion of the fuse region when a write voltage is applied to the gate electrode. However, in some cases, the center portion of the fuse region is blown rather than the edge portion. In such an event, after the blowing, a fuse poly (fuse region) and a lower well may form a reverse-biased diode. In such an event, the corresponding unit cell becomes a defective cell.

SUMMARY

In one general aspect, there is provided a one-time programmable (OTP) memory cell including: a well of a first conductivity type; a gate insulating layer formed on the well and including first and second fuse regions; a gate electrode of a second conductivity type formed on the gate insulating layer, the second conductivity type being opposite in electric charge to the first conductivity type; a junction region of the second conductivity type formed in the well and arranged to surround the first and second fuse regions; and an isolation layer formed in the well between the first fuse region and the second fuse region.

The general aspect of the OTP memory cell may further include a well tap of the first conductivity type formed in the well in contact with the junction region.

The general aspect of the OTP memory cell may further include a semiconductor substrate, the well being formed in the semiconductor substrate by injecting ions of the first conductivity type, and the well tap having a higher concentration of ions of the first conductivity type than the well.

In the general aspect of the OTP memory cell, the gate electrode may further comprise: a body portion; and at least one projection portion extending from the body portion toward the well tap and having a width that is smaller than a width of the body portion.

In the general aspect of the OTP memory cell, the junction region may be formed on an outside of the gate electrode and may be arranged to surround the at least one projection portion.

In the general aspect of the OTP memory cell, the gate electrode may comprise two projection portions, and the isolation layer may be arranged between the two projection portions and may extend farther toward the well tap in comparison to the two projection portions.

In the general aspect of the OTP memory cell, the gate insulating layer may further comprise a capacitor region that is thicker than the fuse region.

In the general aspect of the OTP memory cell, the capacitor region of the gate insulating layer may extend farther toward the well tap than the body portion of the gate electrode.

In the general aspect of the OTP memory cell, only the capacitor region of the gate insulating layer may be provided below the body portion of the gate electrode, and both the fuse region and the capacitor region of the gate insulating layer may be provided below the projection portion of the gate electrode.

In the general aspect of the OTP memory cell, the gate electrode may comprise one projection portion, and the projection portion may be arranged to cover at least a part of the isolation layer.

In the general aspect of the OTP memory cell, the isolation layer may extend farther toward the well tap than the projection portion of the gate electrode, and the isolation layer may be embedded below the gate electrode.

In the general aspect of the OTP memory cell, the gate electrode may comprise two projection portions, and one region of the junction region may exist between the projection portion and the isolation layer.

In the general aspect of the OTP memory cell, the isolation layer may extend farther toward the well tap than the projection portion and may partially overlap the projection portion.

The general aspect of the OTP memory cell may further comprise an implant layer formed on a surface portion of the well by an injection of ions of the second conductivity type.

In another general aspect, there is provided an OTP memory cell comprising: a well formed by injecting ions of a first conductivity type; a gate insulating layer formed on the well and comprising at least one fuse region; a gate electrode formed on the gate insulating layer and doped with ions of a second conductivity type, the second conductivity type being opposite in electric charge to the first conductivity type; an implant layer formed on a surface portion of the well by injecting ions of the second conductivity type; and a junction region formed in the well by injecting ions of the second conductivity type and arranged to surround the at least one fuse region.

The general aspect of the OTP memory cell may further comprise a well tap formed in the well by injecting ions of the first conductivity type, the well tap being arranged to be in contact with the junction region.

In the general aspect of the OTP memory cell, the gate electrode may comprise: a body portion; and at least one projection portion extending from the body portion toward the well tap and having a width that is smaller than a width of the body portion.

In the general aspect of the OTP memory cell, the gate insulating layer may further comprise a capacitor region that is thicker than the fuse region.

In the general aspect of the OTP memory cell, only the capacitor region of the gate insulating layer may be provided below the body portion of the gate electrode, and both the fuse region and the capacitor region of the gate insulating layer may be provided below the projection portion of the gate electrode.

In another general aspect, there is provided an OTP memory cell comprising: a first conductivity type well; a gate insulating layer formed on the well; a second conductivity type gate electrode formed on the gate insulating layer, the second conductivity type being opposite to the first conductivity type in electric charge, and the gate electrode comprising a body portion and two projection portions; a second conductivity type junction region formed on the well to surround the two projection portions; and an isolation layer formed in the well between the two projection portions.

The general aspect of the OTP memory cell may further comprise a first conductivity type well tap arranged to be in contact with the junction region.

In the general aspect of the OTP memory cell, the isolation layer and the two projection portions may extend toward the well tap, and the isolation layer may extend farther toward the well tap than the two projection portions.

In another general aspect, there is provided a method for forming a one-time programmable (OTP) memory cell, the method involving: forming an isolation layer in a first conductivity type well; forming a gate insulating layer and a gate electrode on the well, wherein the gate insulating layer comprises a capacitor region, a first fuse region, and a second fuse region; and exposing an upper portion of the well on which the gate insulating layer and the gate electrode is formed to ions of a second conductivity type to form a junction region that surrounds the gate electrode.

In the general aspect of the method, the forming of the isolation layer may comprise forming a trench in the well and filling the trench with silicon oxide.

In the general aspect of the method, the capacitor region may have a greater thickness than the first fuse region and the second fuse region, and the difference in thickness of the capacitor region and the first and second fuse regions may be obtained by depositing a gate insulating layer material of a predetermined thickness on the well and then etching the first and second fuse regions.

In the general aspect of the method, the gate electrode may be doped with ions of the second conductivity type when the junction region is formed by exposing the well to the ions of the second conductivity type.

The general aspect of the method may further involve forming a well tap of a first conductivity type in the well, the concentration of ions of the first conductivity type being higher in the well tap than in the well.

Other features and aspects may be apparent from the following detailed description, the drawings, and the claims.

Figure 1:
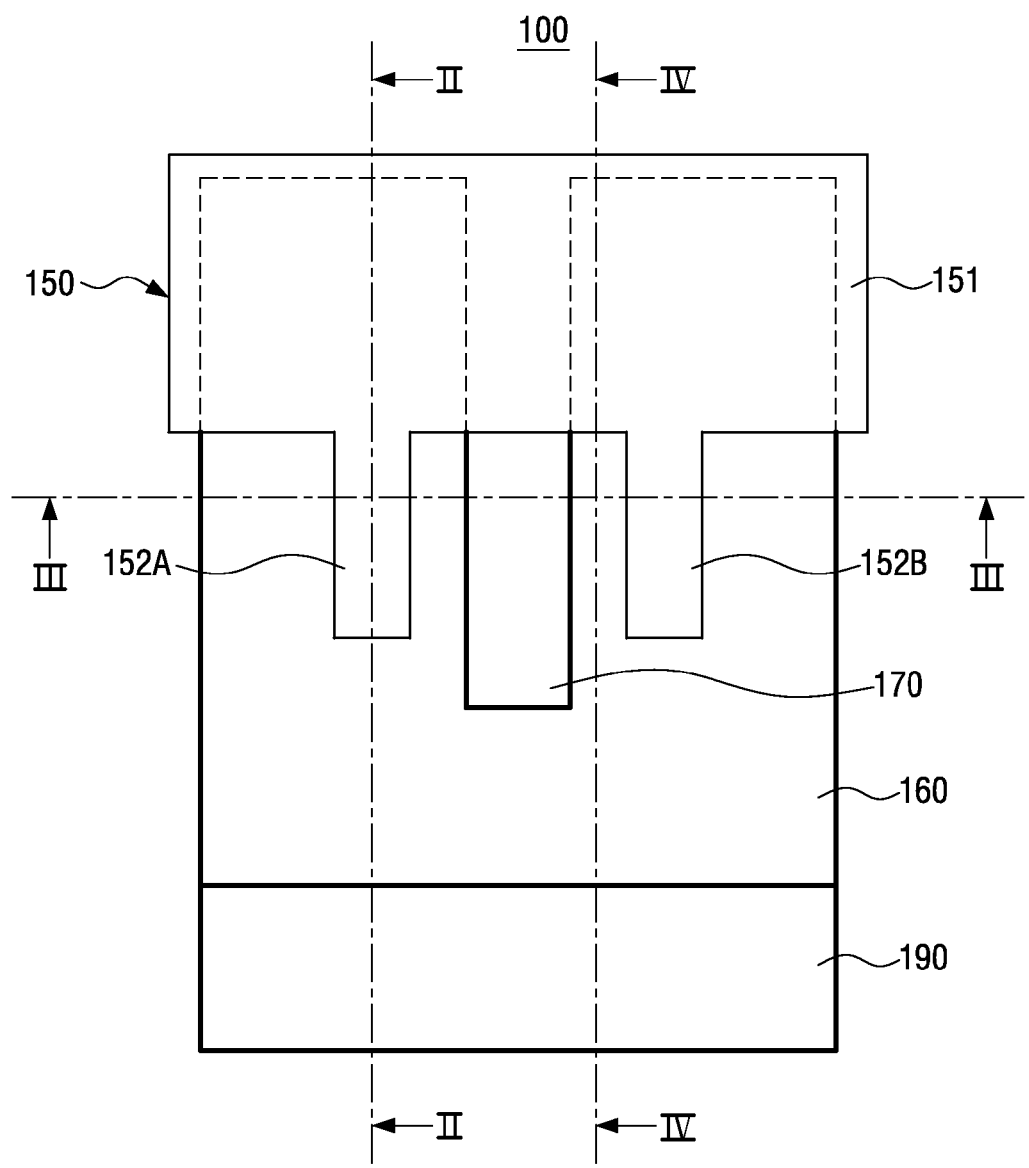
FIG. 1 is a schematic plan view illustrating an example of an OTP memory cell.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION OF THE DRAWINGS

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

Hereinafter, various examples of anti-fuse OTP memory cells are described in detail with reference to the accompanying drawings. For convenience of explanation, drawings are schematically illustrated and partial configurations that are not the core subject of discussion may have been omitted for conciseness.

According to a general aspect, an anti-fuse OTP memory cell may have two or more fuse regions, which can increase blowing possibility of the fuse regions and prevent defects of the corresponding cell even if a center portion of the fuse region is blown.

Figure 2A:
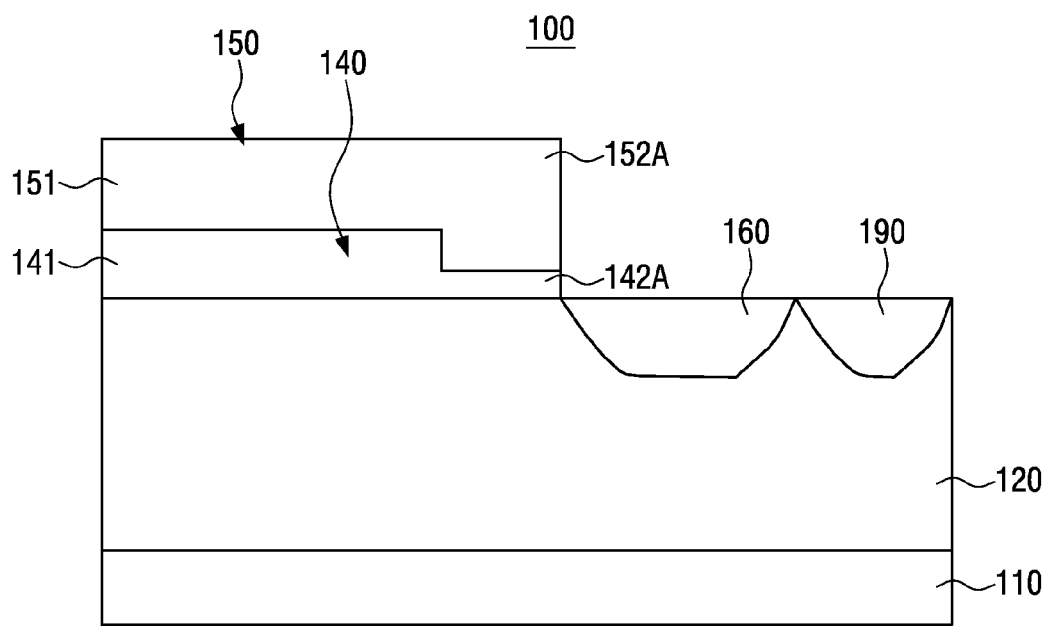
FIG. 2A is a cross-sectional view of the example of the OTP memory cell illustrated in FIG. 1 taken along line II-II of FIG. 1.
Figure 2B:
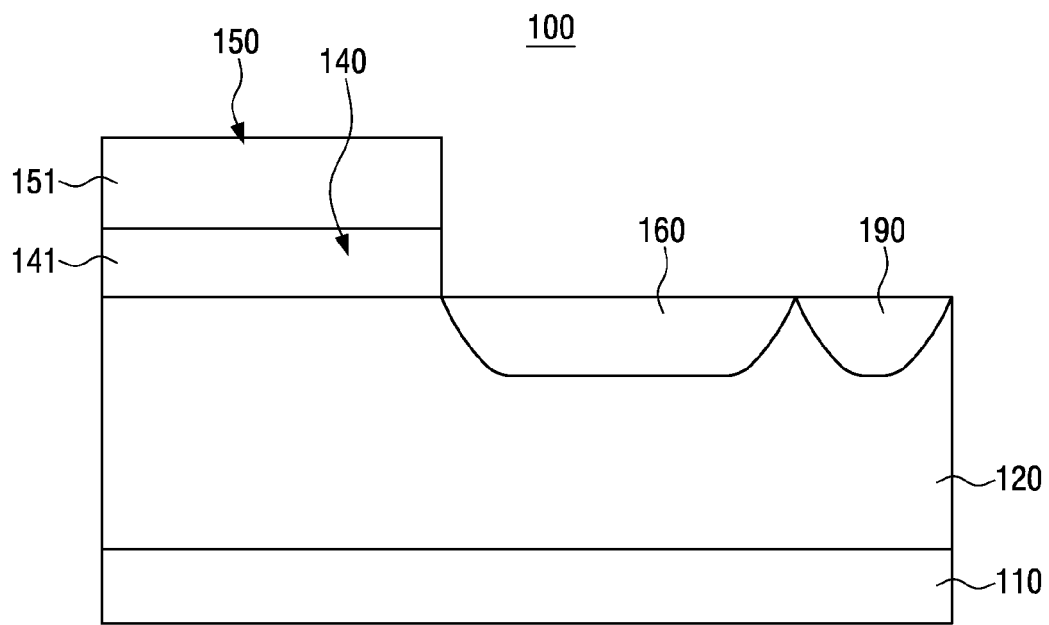
FIG. 2B is a cross-sectional view of the example of the OTP memory cell illustrated in FIG. 1 taken along line IV-IV of FIG. 1.
Figure 3:
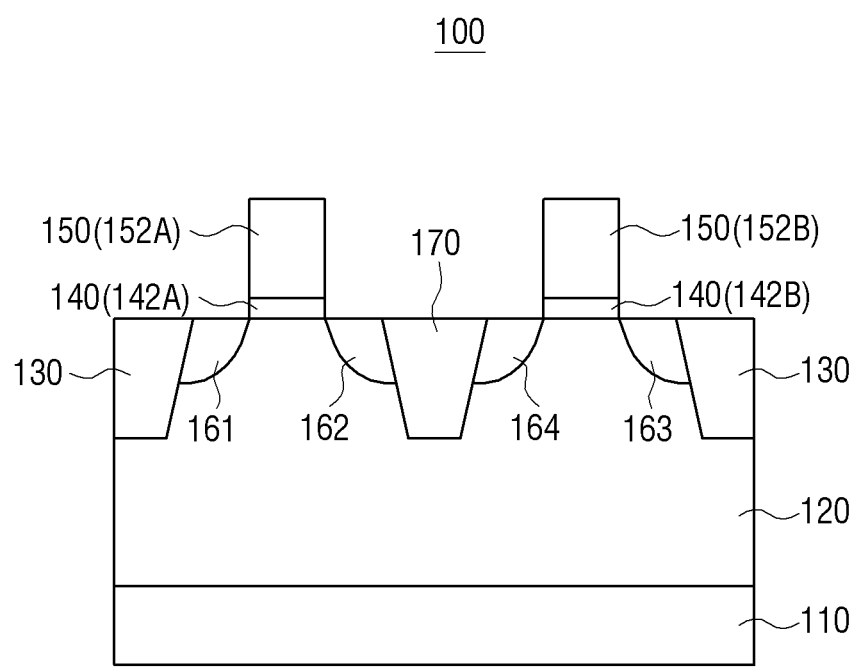
FIG. 3 is a cross-sectional view of the example of the OTP memory cell illustrated in FIG. 1 taken along line III-III of FIG. 1.

FIG. 1 is a schematic plan view illustrating an example of an OTP memory cell. FIG. 2A is a cross-sectional view of the OTP memory cell illustrated in FIG. 1 taken along line II-II of FIG. 1. FIG. 2B is a cross-sectional view of the OTP memory cell illustrated in FIG. 1 taken along line IV-IV of FIG. 1. FIG. 3 is a cross-sectional view of the OTP memory cell illustrated in FIG. 1 taken along line III-III of FIG. 1.

Referring to FIGS. 1 to 3, an OTP memory cell 100 according to the first example includes a semiconductor substrate 110, a gate insulating layer 140, a gate electrode 150, a junction region 160, a well tap 190, and an intermediate isolation layer 170.

In FIG. 1, the gate electrode 150 includes a body portion 151 and first and second projection portions 152A and 152B. The gate electrode 150 is designed so that blowing occurs in the first and second projection portions 152A and 152B. Two projection portions are provided to fabricate OR type OTP fuses. The projection portions serve as fuses, and serve to cope in the event that one fuse is a soft breakdown defect cell and the other fuse is normal. Even if one fuse is defective, it is likely that the other fuse would be normal. Thus, there is a high possibility that the other fuse that is normal may be blown, and the blowing yield of the overall cell can be increased by forming an OR type cell in this manner.

Referring to FIG. 2A, the thickness of the gate insulating layer 140 is thinner in a region above which the first and second projection portions 152A and 152B are formed, in comparison to a region above which the body portion 151 of the gate electrode 150 is formed. Thus, in the event that the same voltage is applied to both regions, the region of the gate insulating layer located below the first and second projection portions 152A and 152B has a smaller thickness and is more likely to be blown.

As illustrated in FIG. 2A, the junction region 160 is formed in an outer region of the gate electrode 150. This is because the junction region 160 is formed through an ion injection process after forming the gate electrode 150. Further, as illustrated in FIG. 2B, the junction region 160 is formed as to surround the gate electrode 150, and extends to the space between the first and second projection portions 152A and 152B. As illustrated in FIG. 3, the intermediate isolation layer 170 is formed between the first projection portion 152A and the second projection portion 152B to separate the junction region 160.

As illustrated in FIG. 1, the intermediate isolation layer 170 is formed as to protrude toward a well tap 190. However, in this example, the intermediate isolation layer 170 does not extend to the well tap 190, but extends only to the middle of the junction region 160. In this example, it is preferable that the intermediate isolation layer 170 extends farther towards the well tap 190 than the first and second projection portions 152A and 152B. For example, in the vent that the blowing occurs in the region of the gate insulating layer 140 above which the first projection portion 152A is formed, a voltage drop occurs. Since the intermediate isolation layer 170 is extended farther towards the well tap 190, a path through which a voltage is transferred from the junction region 160 formed in the vicinity of the first projection unit 152A to the vicinity of the second projection portion 152B is lengthened by the extended portion. As a consequence, the transfer speed of the voltage that has been dropped through the junction region may be reduced, and the probability that the corresponding portion is broken due to the voltage transferred to the first projection portion 152A is increased to that extent. If the path between the first projection portion 152A and the second projection portion 152B is too close, problems described above may occur. In one example, the difference in length between the projection portion and the intermediate isolation layer may be set to 0.1 to 0.3 μm. In another example, the length of the projection portion may be set to 0.5 μm, and the length of the intermediate isolation layer 170 that starts from the body portion may be set to 0.6 to 0.8 μm. In such an example, the width of the intermediate isolation layer 170 may be 0.3 to 0.4 μm.

As illustrated in FIGS. 1 and 2A, the well tap 190 and the junction region 160 are arranged to be in a physical contact with each other. In this example, because the well 120 is P type, the well tap 160 is also P type. With the help of the well tap 190, a predetermined voltage (for example, 0V) may be applied to the well 120.

The reference numeral "130" in FIG. 3 denotes a device isolation layer that defines an active region of the OTP memory cell 100. In FIGS. 1 and 2A, the device isolation layer 130 is omitted for convenience in explanation. The reference numeral "190" in FIG. 1 denotes a well tap that is formed by injecting ions of the same conductivity type as the well 120. However, the well tap 190 is injected with a higher density of ions than the well 120.

The semiconductor substrate 110 includes the well 120 formed by doping P-type ions through the ion injection process. In other words, the semiconductor substrate 100 includes a P-type well 120. The semiconductor substrate 110 may be fabricated, for example, using a silicon substrate.

The gate insulating layer 140 is formed on the semiconductor substrate 110, and more specifically, on the well 120 of the semiconductor substrate 110. The gate insulating layer 140 includes a capacitor region 141 and first and second fuse regions 142A and 142B formed to extend from the capacitor region 141 toward the well tap 190. As illustrated in FIG. 2A, the capacitor region 141 is formed with a thickness that is thicker than that of the fuse regions 142A and 142B; thus, the gate insulating layer 140 forms a step-shaped structure between the capacitor region 141 and the fuse regions 142A and 142B, due to the difference in the thickness of the regions. The gate insulating layer 140 formed on the fuse regions 142A and 142B is relatively thinner than the gate insulating layer 140 formed on the capacitor region 141, and if a constant voltage is applied for blowing, the gate insulating layer 140 that is formed below the fuse regions 142A and 142B is first broken.

The gate electrode 150 is formed on the gate insulating layer 140, and is arranged to overlap the gate insulating layer 140. Accordingly, the gate electrode 150 includes the body portion 101 that overlaps the capacitor region 141 of the gate insulating layer 140 and the first and second projection portions 152A and 152B that overlap the first and second fuse regions 142A and 142B of the gate insulating layer 140. The gate electrode 150 has a doping type that is opposite to the doping type of the well 120 of the semiconductor substrate 110. As described above, since the well 120 of the semiconductor substrate 110 may be formed by injecting P-type ions, the gate electrode 150 may be doped with N-type ions. Alternatively, if the well 120 of the semiconductor substrate 110 is form with N-type ions, the gate electrode 150 is formed with a P-type material.

The junction region 160 is formed in the well 120 by injecting ions of the same conductivity type as the conductivity type of the gate electrode 150. Accordingly, in the same manner as the gate electrode 150, the junction region 160 has a doping type that is opposite to the doping type of the well 120 of the semiconductor substrate 110. In this example, since the gate electrode 150 is doped with the N-type ions, the junction region 160 is formed by injection of the N-type ions. As an alternative, if the well 120 of the semiconductor substrate 110 is formed with N-type ions, the junction region 160 is formed with a P-type material.

As illustrated in FIGS. 1 to 3, in one example of the OPT memory cell 100, the junction region 160 surrounds the first and second fuse regions 142A and 142B of the gate insulating layer 140, and the first and second projection portions 152A and 152B of the gate electrode 150 overlaps with the first and second fuse regions 142A and 142B of the gate insulating layer 140 in a plan view. Further, the junction region 160 includes a first outer junction region 161 and a first inner junction region 162 arranged on the outer side and the inner side of the first fuse regions 142A to surround the first fuse region 142A, and a second outer junction region 163 and a second inner junction region 164 arranged on the outer side and the inner side of the second fuse region 142A. In other words, the first outer junction region 161 is arranged to be in contact with an outer edge of the first fuse region 142A, and the first inner junction region 162 is arranged to be in contact with an inner edge of the first fuse region 142A. Further, the second outer junction region 163 is arranged to be in contact with an outer edge of the second fuse region 142B, and the second inner junction region 164 is arranged to be in contact with an inner edge of the second fuse region 142B.

The intermediate isolation layer 170 is formed on one region of the semiconductor substrate 110 between the first fuse region 142A and the second fuse region 142B. The intermediate isolation layer 170 is formed by forming a trench on the semiconductor substrate 110 and filling the trench with an insulating material. For example, the trench may be formed with silicon oxide.

The junction region portion arranged between the first fuse region 142A and the second fuse region 142B is spatially separated into two portions by the intermediate isolation layer 170. That is, the first inner junction region 162 and the second inner junction region 164 of the junction region 160 are spatially separated by the intermediate isolation layer 170.

As described above, by arranging the intermediate isolation layer 170 between the first inner junction region 162 and the first inner junction region 164, even if any one of the two fuse regions 152A and 152B is first blown during a write operation, the voltage that is applied to the other fuse region is not dropped. Accordingly, blowing of the other remaining fuse region can be successfully performed. As a result, during a read operation, the OTP memory cell 100 can be read without a defect (read as "ON").

Figure 4A:
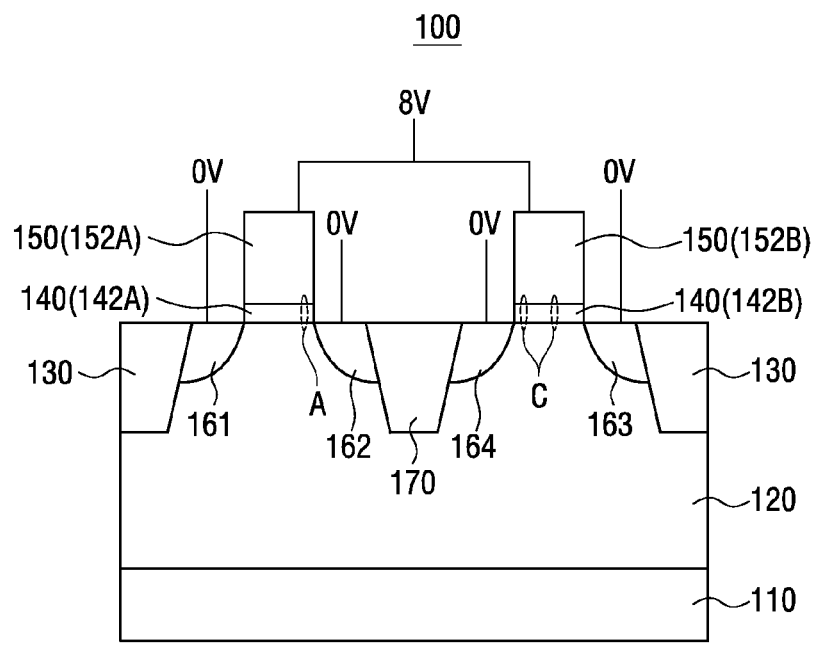
FIG. 4A is a cross-sectional view illustrating an example in which a gate voltage of, for example, 8V is applied to the OTP memory cell of FIG. 1.

As illustrated in FIG. 4A, in an example in which a write voltage of 8V is applied for the blowing of the fuse regions 142A and 142B during a write operation, according to the OTP memory cell 100 according to one example, even if any one of the two fuse regions 142A and 142B is blown, the voltage that is applied to the other remaining fuse region is kept "8V." Thus, the blowing of the other remaining fuse region can be smoothly performed. FIG. 4A illustrates an example in which a region "A" of the first fuse region 142A is first blown, and then a region "C" of the second fuse region 142B is blown as an example.

Figure 4B:
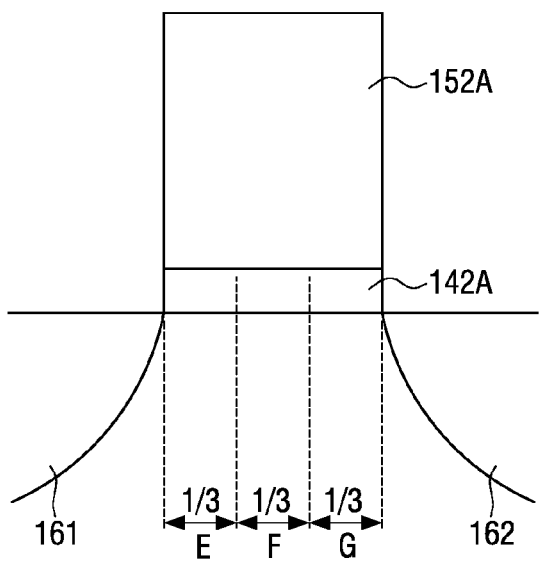
FIG. 4B is an enlarged view of the OTP memory cell illustrated in FIG. 4A.

FIG. 4B is an enlarged view of the OTP memory cell 100 illustrated in FIG. 4A. In the OTP memory cell 100 illustrated in FIG. 4B, the region "F" found in the middle of the fuse region 142A is referred to as the center portion of the fuse region 142A. The regions "E" and "G," which are located at the edge of the fuse region 142A is referred to as the edge portion.

Figure 5:
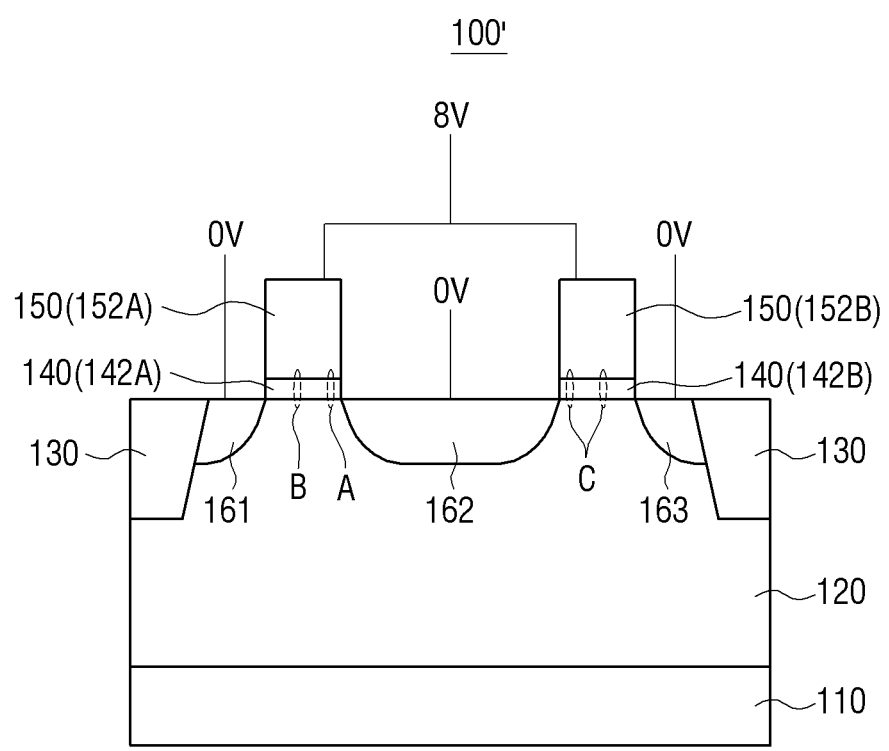
FIG. 5 is a cross-sectional view illustrating an example in which a gate voltage of, for example, 8V is applied to the memory cell in which an intermediate isolation layer is not provided.

By contrast, referring to FIG. 5, in an example of the OTP memory cell 100' that is provided with no intermediate isolation layer 170, if any one of the two fuse regions 142A and 142B is blown, the voltage that is applied to the other remaining fuse region may drop. Thus, there is a high possibility that the blowing of the other remaining fuse region results in a failure as well. If the blowing fails, the corresponding memory cell has a resistance value that exceeds a readable range, and thus may be read as a memory cell in which write operation has not been performed (that is, wrongly read as "OFF"). That is, in the event that the left fuse region 142A of the two fuse regions 142A and 142B is broken at a point "A" thereof (located at an edge portion), the lower N active potential 162 is instantaneously heightened (for example, heightened from 0V to 2V). Thus, in the illustrated example, the voltage that is applied to the other right fuse region 142B becomes 8−2=6V. In this example, since a voltage that is smaller than 8V is applied, the right fuse region may not be broken at a point "C" thereof (end portion or intermediate portion). If only the point "A" is broken but the point "C" is not broken, there is a problem in the case where the resistance value after the breaking of the point "A" is, for example, 10,000Ω. Since the reference resistance value must be equal to or lower than 1,000Ω during the read operation, the resistance value of 10,000Ω causes the corresponding memory cell to be wrongly read as "OFF"). Thus, the state of the memory cell is not changed from "OFF" to "ON" to cause a problem.

Figure 6A:
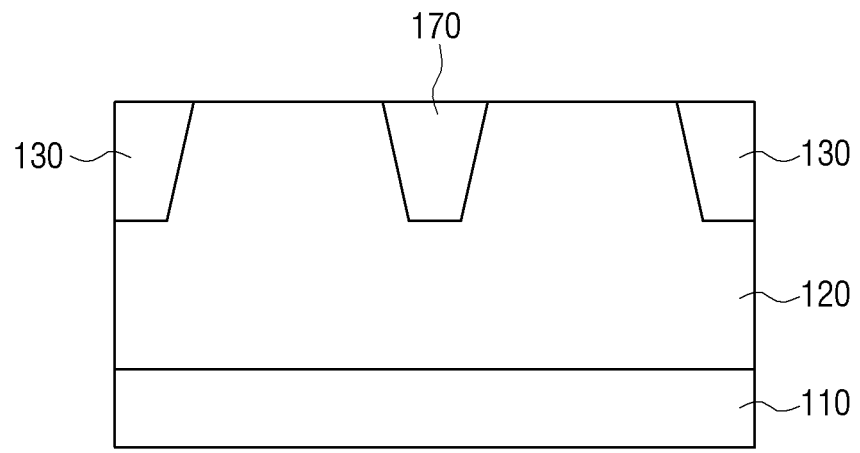
FIGS. 6A to 6C are cross-sectional views sequentially illustrating processes of an example of a method for fabricating the OTP memory cell illustrated in FIGS. 1 to 3.
Figure 6B:
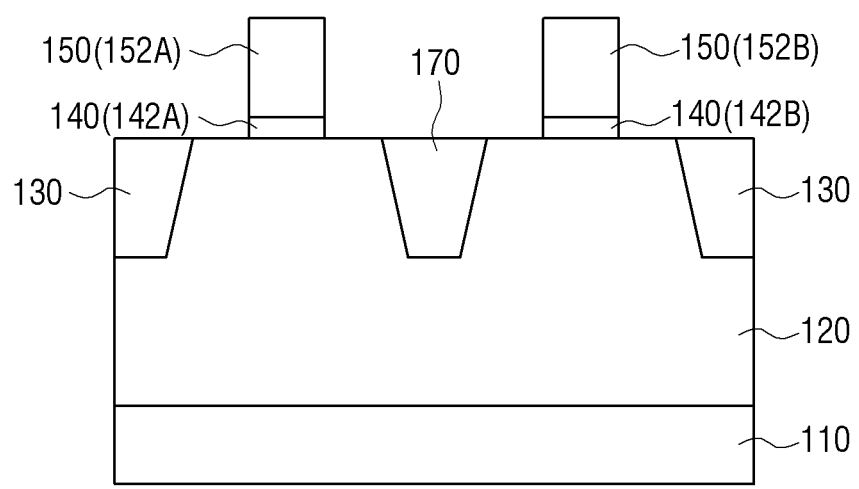
Figure 6C:
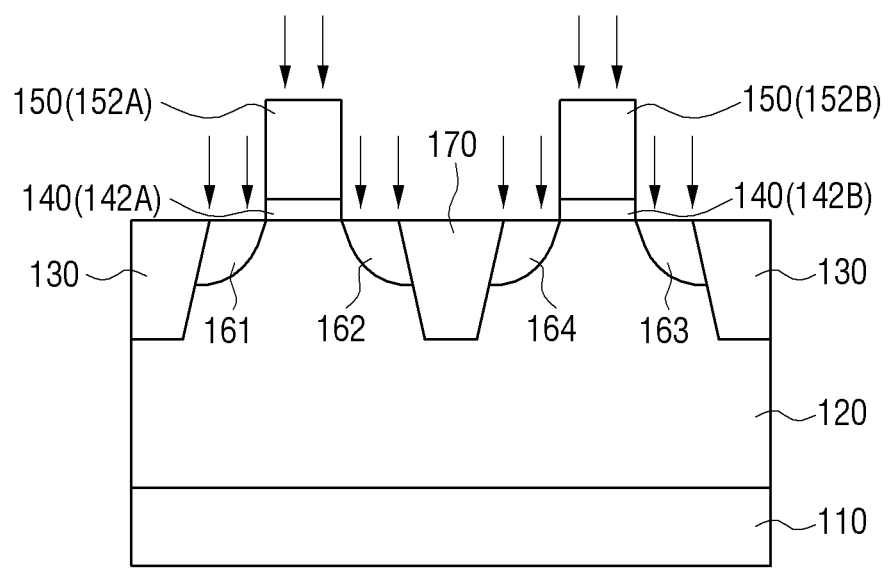

FIGS. 6A to 6C are cross-sectional views sequentially illustrating processes of an example of a method for fabricating the OTP memory cell 100 illustrated in FIGS. 1 to 3.

Referring to FIG. 6A, the device isolation layer 130 and the intermediate isolation layer 170 are first formed on the semiconductor substrate 110. The device isolation layer 130 and the intermediate isolation layer 170 may be formed by forming a trench and then filling the trench with the insulating material such as, for example, silicon oxide. By injecting P-type ions from the upper side of the semiconductor substrate 110 after forming the isolation layers 130 and 170, the P well 120 is formed on the semiconductor substrate 110.

Referring to FIG. 6B, the gate insulating layer 140 that includes the first and second fuse regions 142A and 142B is formed on the well 120 of the semiconductor substrate 110, and then the gate electrode 150 is formed on the gate insulating layer 140 so as to be arranged to overlap the gate insulating layer 140. For example, the gate insulating layer 150 may be formed through using a wet oxidation process or an oxidation process using radical ions. As illustrated in FIG. 2A, there is a stepped difference between the capacitor region 141 of the gate insulating layer 140 and the fuse regions 142A and 142B, and such a step-shaped structure may be formed, for example, by depositing a gate insulating layer material with a predetermined thickness and then etching the fuse regions 142A and 142B with a predetermined thickness by an etching process. On the other hand, the gate electrode 150 may be made of any one material selected from polysilicon and metal electrode.

Referring to FIG. 6C, lastly, the gate electrode 150 is doped with an N type by injecting N-type ions from the upper side of the semiconductor substrate 110, and the N-type junction region 160 is formed in the well 120 of the semiconductor substrate 110. As described above, the junction region 160 includes the first outer junction region 161, the first inner junction region 162, the second outer junction region 163, and the second inner junction region 164. Here, the first inner junction region 162 and the second inner junction region 164 are arranged to be spatially separated by the intermediate isolation layer 170 that has been already performed.

Figure 7:
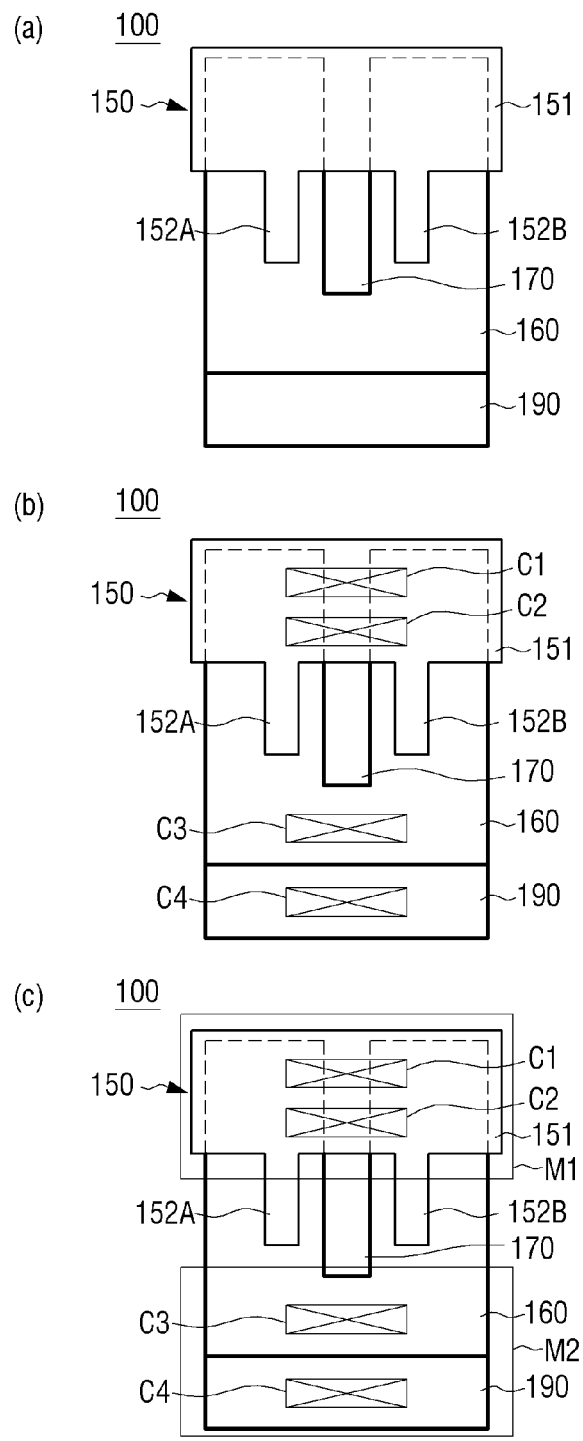
FIG. 7 is a view sequentially illustrating the layout through additional processes of the OTP memory cell illustrated in FIGS. 1 to 3.

FIG. 7 is a view sequentially illustrating the layout through additional processes of the OTP memory cell 100. After the active region that may be the junction region 160 and the gate electrode 150 are formed, a contact plug process is performed as shown in (b) of FIG. 7. That is, poly contacts C1 and C2 connected to the gate electrode 150, N-type active contact C3 that is in contact with the junction region 160, and P-type active contact C4 connected to the P-type well tap 190 are formed. Thereafter, as shown in (c) of FIG. 7, on the poly contacts C1 and C2, a metal layer M1 and a metal layer M2 for simultaneously connecting the N-type active contact C3 and the P-type active contact C4 are formed as the same layer. In this example, the two metal layers M1 and M2 must be spaced apart from each other by a predetermined distance.

Figure 8:
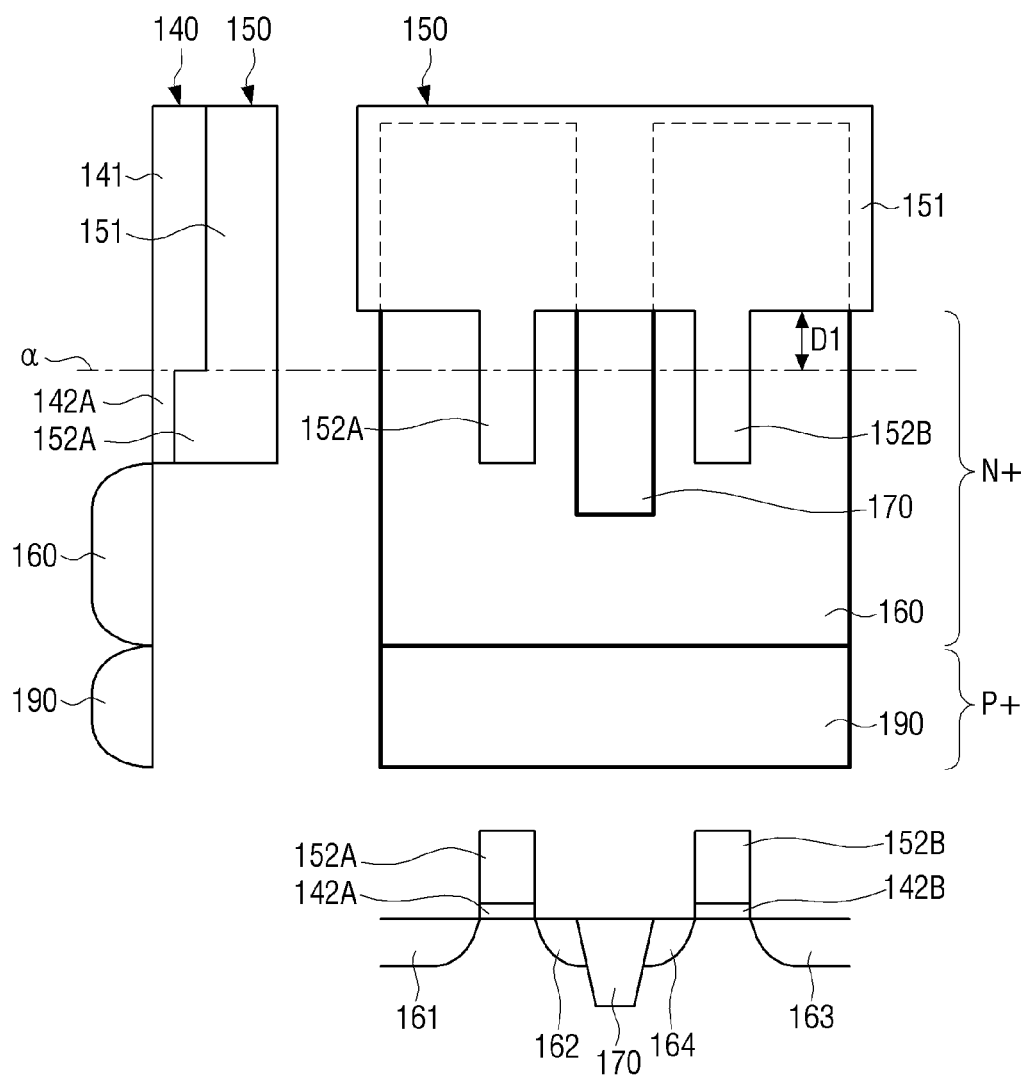
FIG. 8 is a view illustrating the OTP memory cell of FIGS. 1, 2, and 3 on one plane.

FIG. 8 is a view illustrating the OTP memory cell of FIGS. 1, 2, and 3 on one plane. In this example, two projection portions 152A and 152B extend toward the well tap 190, the junction region exists between the projection portion and the intermediate isolation layer, and the length of the intermediate isolation layer 170 is longer than the length of the projection portions 152A and 152B. In the example shown in FIG. 8, the junction region 160 is an N+ ion injection region, and the well tap 190 is a P+ ion injection region. Since the gate insulating layer 140 has a pair of fuse regions 142A and 142B, the boundary between the capacitor region 141 of the gate insulating layer 140 and the fuse regions 142A and 142 B is important. As shown in FIG. 8, the relatively thick capacitor region 141 is further extended from the point where the projection portion starts to a line α as long as D1 (about 0.1 to 0.3 μm). That is, the gate electrode 150 is divided into the body portion 1512 and the projection portions 152A and 152B, and the capacitor region 141 is extended from the boundary between the body portion 151 and the projection portions 152A and 152B to the line α. Through this, on the inside of the body portion 151 of the gate electrode 150, relatively thin gate oxide (fuse region) is not formed. If thin gate oxide is formed in the region of the body portion 151, several problems may occur. For example, a leakage current path may occur between the body portion 151 and the thin gate oxide, and thus the blowing may not be performed well. Accordingly, it is important to make the blowing occur in the region where the two projection regions and the relatively thins gate oxide region. For this, the relatively thick gate oxide region (capacitor region) is further extended as long as D1. In other words, under the body portion 151, only the thick gate insulating layer exists, and under the respective projection portions, the thick gate insulating layer and the thin gate insulating layer coexist.

In this example, the circumferential length of the thin gate oxide is determined in consideration of the line α as a start point. As the circumferential length is small, it is preferable from the viewpoint of device reliability.

Figure 9:
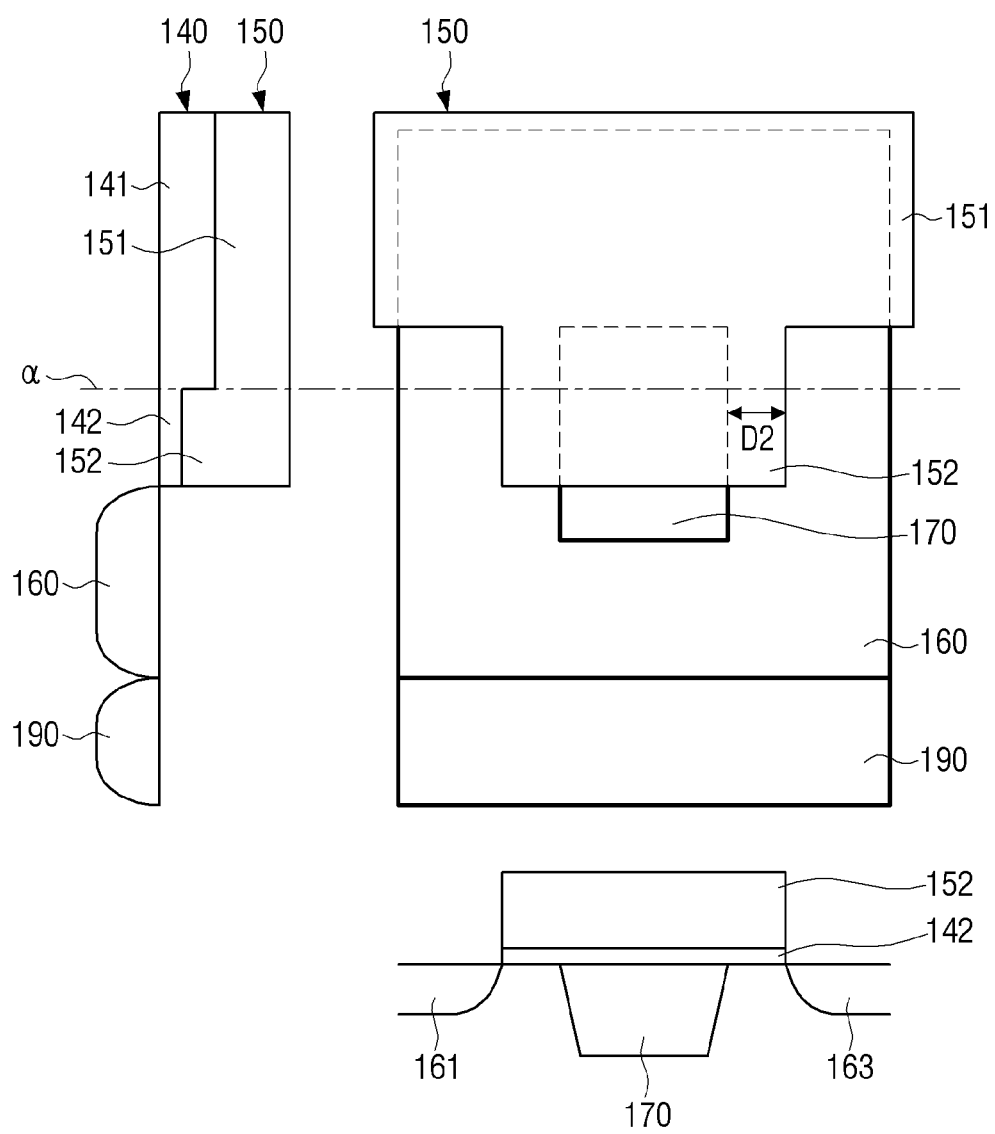
FIGS. 9 and 10 are views illustrating a combination between a body portion and a projection portion of a gate electrode according to additional examples.
Figure 10:
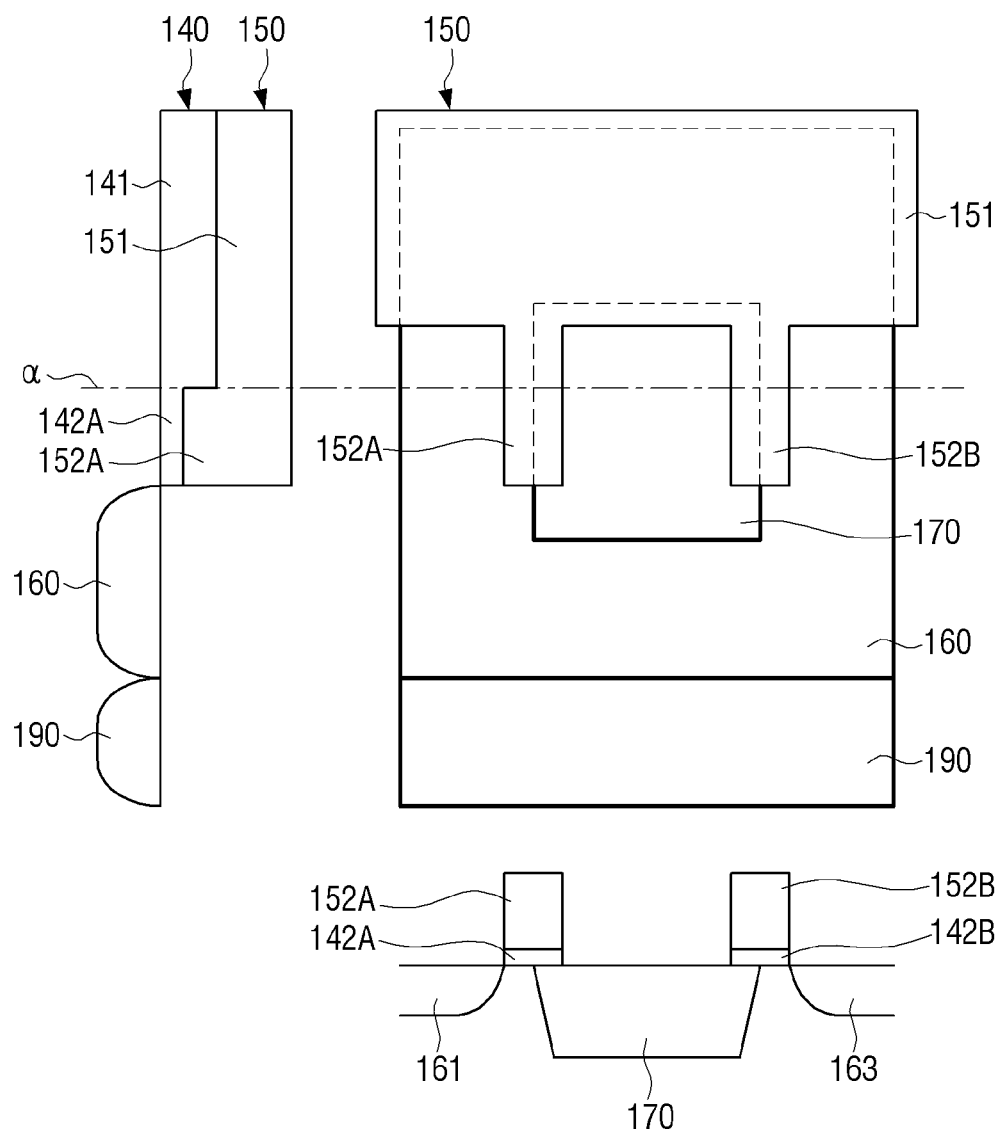

In other examples, the combination shape of the body portion 151 of the gate electrode that may be a fuse electrode and the projection portion 152 may vary as shown in FIGS. 9 and 10. As shown in FIG. 9, one projection portion 152 may extend toward the well tap 190 and the projection portion 152 may widely cover the intermediate isolation layer 170. Further, the length of the intermediate isolation layer 170 may be set to be larger than the length of the projection portion 152, and the intermediate isolation layer 170 may be embedded in the well below the projection portion 152 as illustrated in FIG. 9. In the example illustrated in FIG. 9, D2 that denotes a distance between the outer edge of the intermediate isolation layer 170 and the outer edge of the projection portion 152. The distance D2 may be set to about 0.05 to 0.2 μm. Further, as shown in FIG. 10, two projection portions 152A and 152B may extend toward the well tap 190 and the length of the intermediate isolation layer 170 may be set to be larger than the length of the projection portion 152A and 152B. Further, the intermediate isolation layer 170 may partially overlap with the projection portions 152A and 152B in a plan view.

Figure 11:
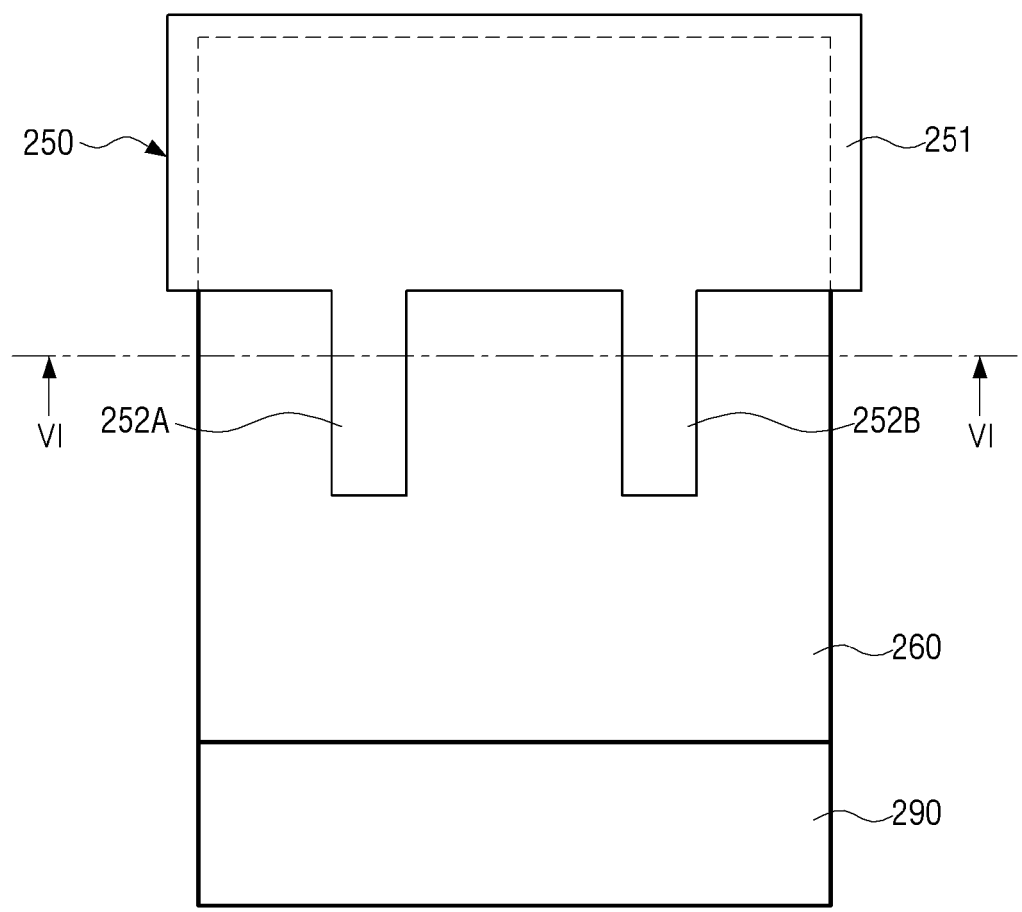
FIG. 11 is a schematic plan view illustrating an OTP memory cell according to yet another example.
Figure 12:
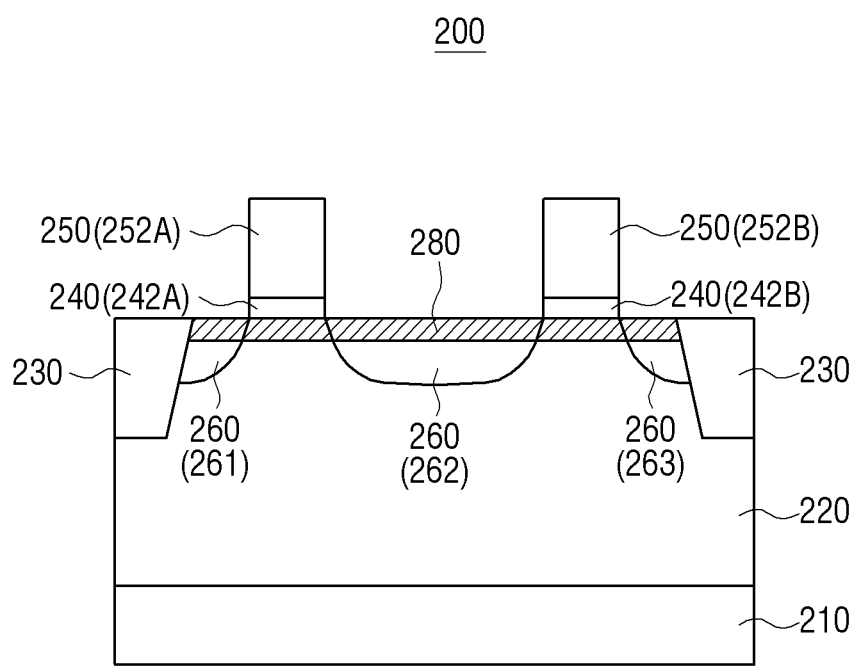
FIG. 12 is a cross-sectional view of the OTP memory cell illustrated in FIG. 11 taken along line VI-VI of FIG. 1.

FIG. 11 is a schematic plan view illustrating another example of an OTP memory cell, and FIG. 12 is a cross-sectional view of the OTP memory cell illustrated in FIG. 11 taken along line VI-VI of FIG. 11. In explaining the OTP memory cell illustrated in FIGS. 11 and 12, the same configuration as the configuration of the OTP memory cell according to the example illustrated in FIGS. 1-3 are simplified or omitted. Thus, the description regarding FIGS. 1-3 applies to this example where appropriate. Features of the memory cell that are distinctive from the OTP memory cells described above are described in details below.

Referring to FIGS. 11 and 12, an OTP memory cell 200 according to another example includes a semiconductor substrate 210, a gate insulating layer 240, a gate electrode 250, a junction region 260, and an implant layer 280.

The semiconductor substrate 210 includes a P-type well 220 that is formed by injecting P-type ions, and the semiconductor substrate 210 may be, for example, a silicon substrate. In other alternative examples, the well 220 may be formed of an N type material.

The gate insulating film 240 and the gate electrode 250 are the same as the gate insulating film 140 and the gate electrode 150 of the above-described OTP memory cell 100. For instance, the gate insulating film 240 includes a capacitor region (not illustrated) and first and second fuse regions 242A and 242B, and the gate electrode 250 includes a body portion 251 and first and second projection units 252A and 252B extended from the body portion 251. The gate electrode 250 is doped with ions having a type that is opposite to the type of the well 220. In this example, since the well 220 is of P type, the gate electrode 250 is doped with P-type ions. In an alternative example, the well 220 may be formed of an N-type material, and the gate electrode 250 may be doped with N-type ions.

The junction region 260 is similar to the junction region 160 according to the OTP memory cell 100 described above in that it includes first and second outer junction regions 261 and 263. However, the junction region 260 is different from the junction region 160 that includes the first and second inner junction regions 162 and 164 in that it includes only one inner junction region 262. This difference is caused by the fact that the memory cell 100 includes the intermediate isolation layer 170 that is arranged between the first and second inner junction regions 162 and 164 whereas the memory cell 200 illustrated in FIG. 11 does not include such an intermediate isolation layer. The junction region 60 is formed of an N-type material as the gate electrode 250. Accordingly, the junction region 260 is formed by injecting N-type ions into the well 220 of the semiconductor substrate 210. In other alternative examples, the well 220 may be formed of an N-type material, and the junction region 260 may be formed of an opposite type material, that is, a P-type material.

The implant layer 280 is formed by injecting ions having a type that is opposite to the well type onto the surface portion of the well 220 after forming the well 220. In this example, since the well 220 is formed of a P-type material, the implant layer 280 is formed by injecting N-type ions. In other alternative embodiments, the well 220 may be formed of an N-type material, and the implant layer 280 may be formed of a P-type material.

By forming the implant layer 280 on the surface portion of the well 220, the implant layer 280 of the same type as the N-type junction region 260, rather than the N-type junction region 260 and the P-type well 220, is arranged just below the fuse regions 242A and 242B of the gate insulating film 240. The concentration of the implant layer 280 is set to be lower than the concentration of the junction region 260. For example, if the concentration of the implant layer 280 is set to be higher than the concentration of the junction region 260, a problem may occur in that the gate oxide is thickly grown. In this example, for instance, if the concentration of the junction region 260 is set to be 1E14 to 1E16 $cm^{-2}$, the implant layer 280 may be set to have a concentration of 1E12 to 1E13 $cm^{-2}$. Further, the depth thereof may be also set to be smaller than the junction region 260. This is to exert no influence on other cells.

The fuse regions 242A and 242B of the gate insulating film 240 may be blown by a write voltage applied thereto during a write operation. It is preferable that such blowing occurs in the edge portions of the fuse regions 242A and 242B. If the blowing occurs in the center portion of the fuse regions 242A and 242B, the N-type gate electrode 250 and the P-type well 220 may form an N/P reverse-biased diode. In such an event, the corresponding memory cell becomes a defective cell during the read operation. Referring to FIG. 5 as described above, if the blowing occurs in a point "B" of the center portion of the fuse regions, the center portion of gate oxide is blown to have a N+(150)/P−(120) structure, and a small amount of current flows by the N+(150)/P−(120) reverse-biased diode even if the voltage is applied to the gate during the read operation. Accordingly, if the gate voltage is not kept over the threshold value Vth due to such leakage, an inversion layer is not produced to cause the occurrence of read defect. That is, the state of the memory cell is not changed from "OFF" to "ON" and causes a problem.

However, according to this example, since the implant layer 280 is arranged to be connected to the junction region 260, the N-type gate electrode and the P-type well 220 do not form the reverse-biased diode even if the blowing occurs in the center area of the fuse regions 242A and 242B. This is because the implant layer is provided between the N-type gate electrode and the P-type well 220 so that the N-type gate electrode and the P-type well are not in direct contact with each other. Accordingly, the defect is prevented from occurring during the read operation of the memory cell 220.

Figure 13A:
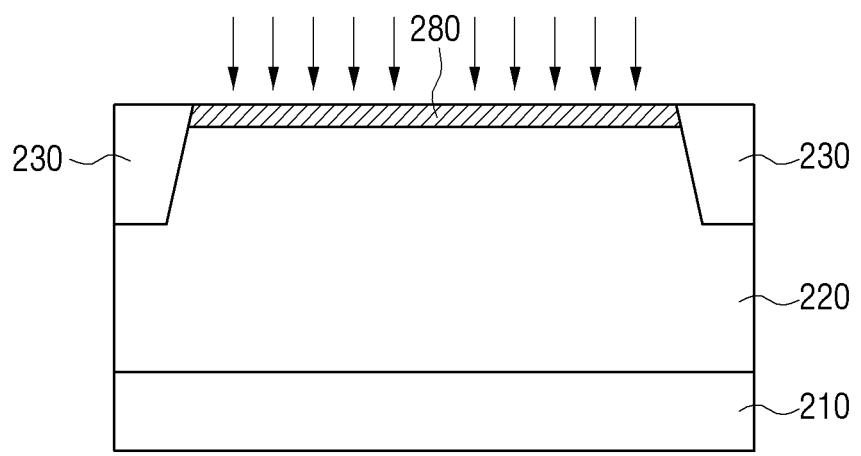
FIGS. 13A to 13C are schematic cross-sectional views sequentially illustrating processes of an example of a method for fabricating the OTP memory cell illustrated in FIGS. 11 and 12.
Figure 13B:
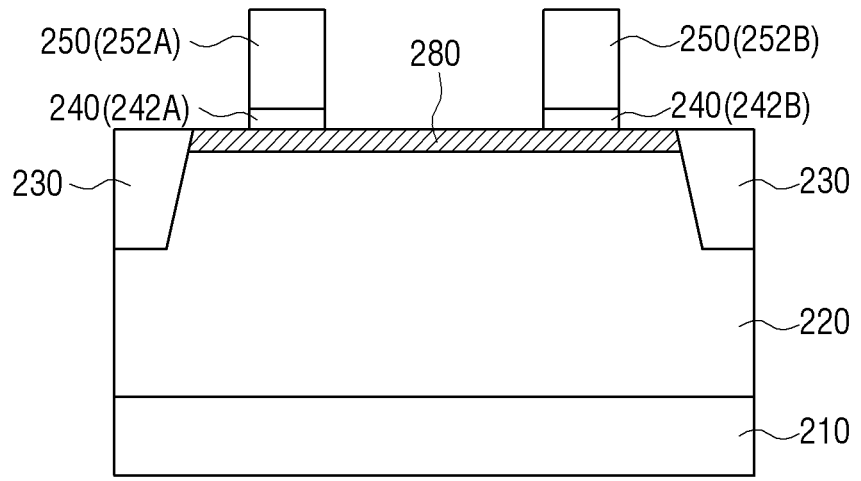
Figure 13C:
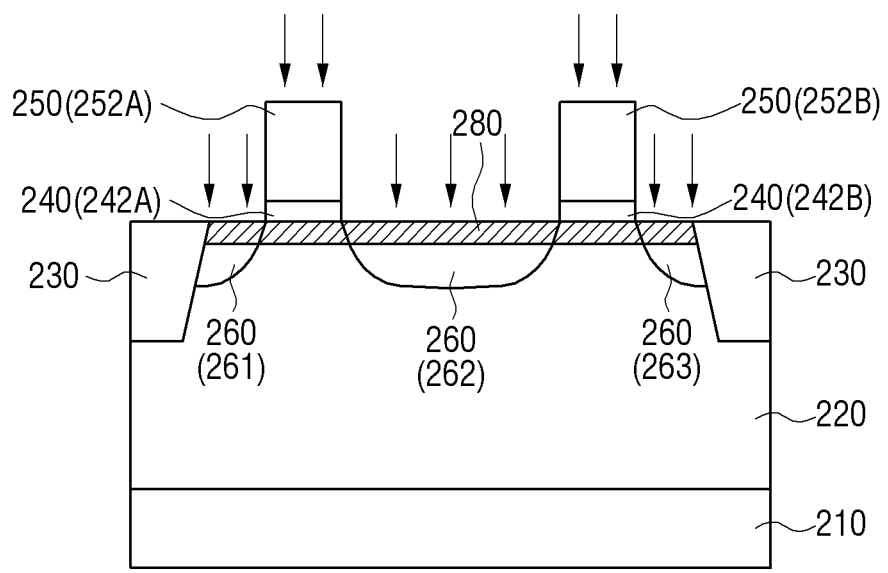

FIGS. 13A to 13C are schematic cross-sectional views sequentially illustrating processes of an example of a method for fabricating the OTP memory cell illustrated in FIGS. 11 and 12. Referring FIGS. 13A to 13C, the method for fabricating the OTP memory cell 200 is described.

Referring to FIG. 13A, the device isolation layer 230 is first formed on the semiconductor substrate 210, and then the well 220 is formed by injecting P-type ions onto the semiconductor substrate 210. Then, the implant layer 280 is formed by injecting N-type ions onto the surface portion of the well 220. As described above, in other examples, the well 220 may be formed of an N-type material, and the implant layer 280 may be formed of an opposite type, that is, a P-type material.

Referring to FIG. 13B, the gate insulating film 240 and the gate electrode 250 are sequentially formed on the well 220 of the semiconductor substrate 210. The gate electrode 240 may be formed using a wet oxidation process or an oxidation process using radical ions. The gate electrode 150 may be made of any one material selected from polysilicon and metal electrode.

Referring to FIG. 13C, by injecting N-type ions from the upper side of the semiconductor substrate 110, the gate electrode 150 is doped with an N-type ion and the N-type junction region 260 is also formed on the well 220 of the semiconductor substrate 210.

Figure 14:
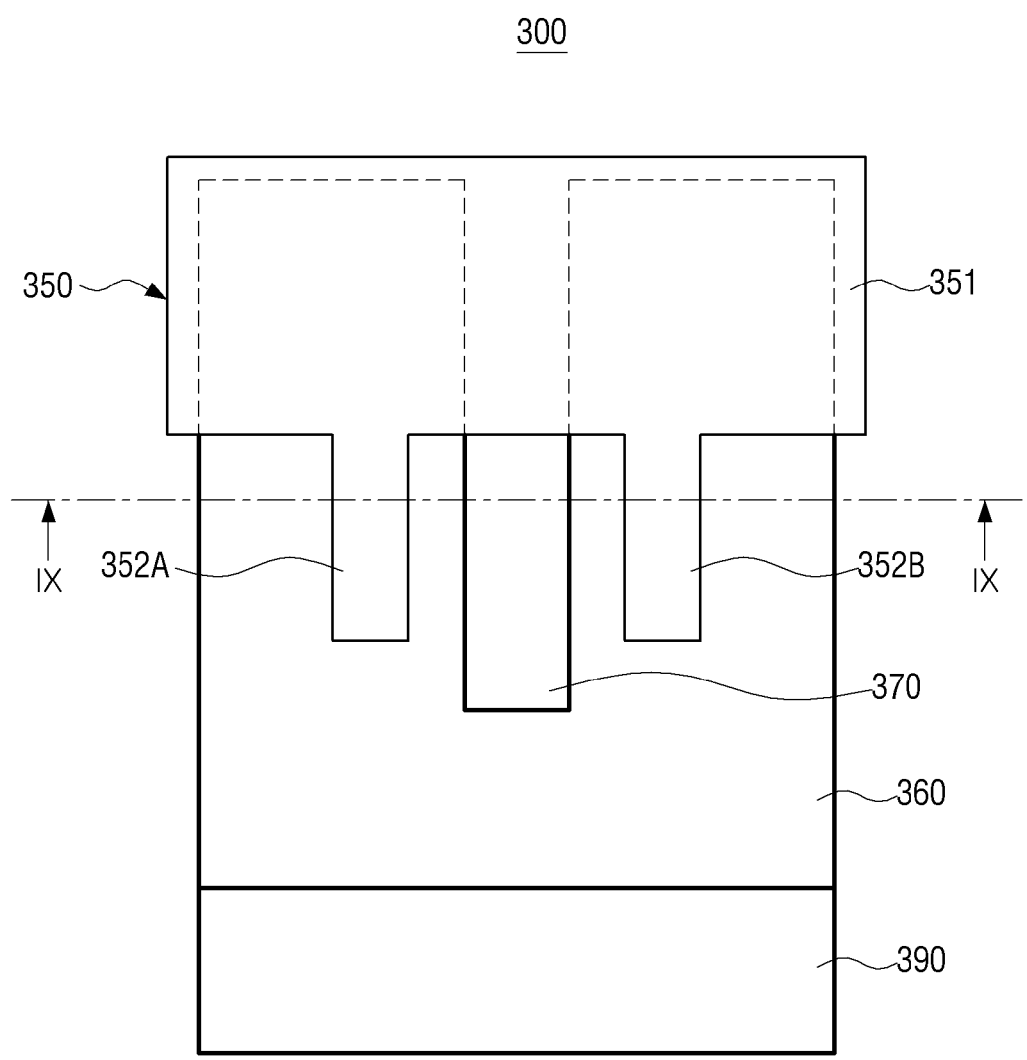
FIG. 14 is a schematic plan view illustrating an OTP memory cell according to another example.
Figure 15:
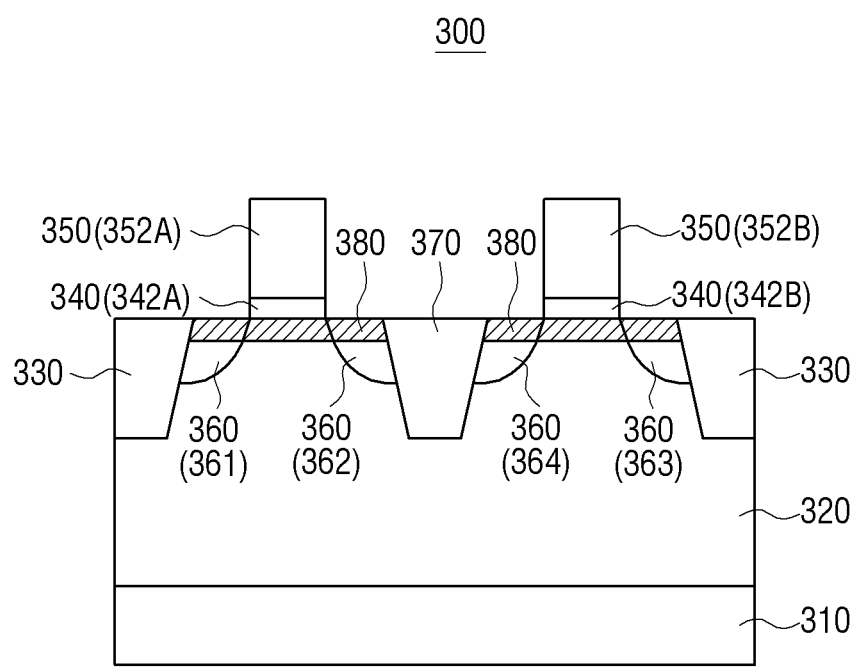
FIG. 15 is a cross-sectional view of the example of the OTP memory cell illustrated in FIG. 14 taken along line IX-IX of FIG. 1.

FIG. 14 is a schematic plan view illustrating another example of an OTP memory cell, and FIG. 15 is a cross-sectional view of the OTP memory cell illustrated in FIG. 14 taken along line IX-IX of FIG. 14. In explaining the OTP memory cell 300 illustrated in FIGS. 14 and 15, explanations for features having the same configuration as the OTP memory cell 100 and the OTP memory cell 200 described above may have been simplified or omitted. Thus, the descriptions above apply to these features. Features that are distinctive from the OTP memory cells 100 and 200 are described in details below.

Referring to FIGS. 14 and 15, an OTP memory cell 300 includes a semiconductor substrate 310, a gate insulating film 340, a gate electrode 350, a junction region 360, an intermediate isolation layer 370, and an implant layer 380. The concentration of the implant layer 380 is set to be lower than the concentration of the junction region 360. In this example, if the concentration of the implant layer is higher than the concentration of the junction region, a problem may occur that the gate oxide is thickly grown. For instance, in an example where the concentration of the junction region is set to be 1E14 to 1E16 $cm^{-2}$, the implant layer may have the concentration of 1E12 to 1E13 $cm^{-2}$. Further, the depth thereof may be also set to be smaller than the junction region 260. This is to exert no influence on other cells.

The semiconductor substrate 310 includes a P-type well 320 that is formed by injecting P-type ions from the upper side. The semiconductor substrate 310 may be, for example, a silicon substrate. In other alternative examples, the well 320 may be formed of an N-type material.

The gate insulating film 340 and the gate electrode 350 are the same as the gate insulating film 140 and the gate electrode 150 of the above-described OTP memory cell 100 as described above. Accordingly, the gate insulating film 340 includes a capacitor region (not illustrated) and first and second fuse regions 342A and 342B extended from the capacitor region (not illustrated), and the gate electrode 350 includes a body portion 351 and first and second projection units 352A and 352B extended from the body portion 351. In this example, the gate electrode 350 is doped with ions having a type that is opposite to the type of the well 320. For instance, since the well 320 is formed of a P-type material, the gate electrode 350 is doped with N-type ions. In other alternative examples, the well 320 may be formed of an N-type material, and the gate electrode 350 may be formed of a P-type material.

The junction region 360 is the same as the junction region 160 of the above-described OTP memory cell 100. Accordingly, the junction region 360 is formed in the well 320 by injecting ions of the same type as the doping type of the gate electrode 350 into the well 320, and the junction region 360 includes the first outer junction region 361, the first inner junction region 362, the second outer junction region 363, and the second inner junction region 364.

The intermediate isolation layer 370 is the same as the intermediate isolation layer 170 of the above-described OTP memory cell 100. Accordingly, the intermediate isolation layer 370 is formed on one portion of the semiconductor substrate 310 between the first fuse region 342a and the second fuse region 342B. As describe above, the intermediate isolation layer 370 is provided, and even if any one of the two fuse regions 342A and 342B is blown, the voltage that is applied to the other remaining fuse region is not dropped (for example, from 8V to 6V). Accordingly, the blowing of the other remaining fuse region can be smoothly performed, and thus the defect of the OTP memory cell 300 can be prevented during the read operation.

The implant layer 380 is almost the same as the implant layer 280 of the above-described OTP memory cell 200. Accordingly, the implant layer 380 is formed by injecting ions having a type that is opposite to the well type onto the surface portion of the well 320 after forming the well 320. As described above, the implant layer 380 is provided, and even if the blowing occurs in the center portion of the fuse regions 342A and 342B, the N-type gate electrode 350 and the P-type well 320 are prevented from forming the N/P reverse-biased diode. This is because the N-type implant layer is provided between the N-type gate electrode and the P-type well 320 so that the N-type gate electrode and the P-type well are not in direct contact with each other. Accordingly, the defect is prevented from occurring during the read operation of the memory cell 300.

Figure 16:
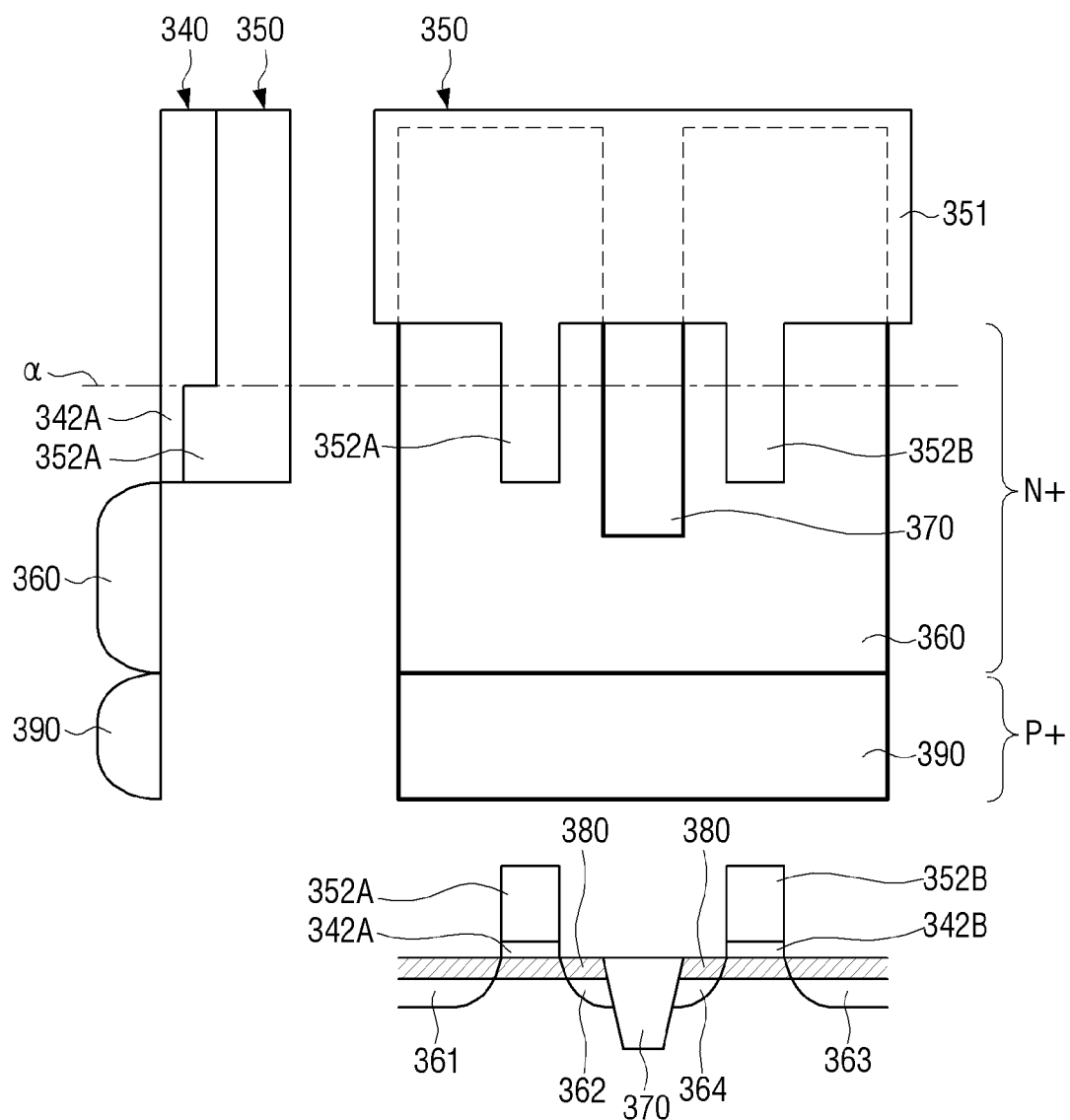
FIG. 16 is a view illustrating the example of the OTP memory cell of the plan views of FIGS. 14 and 15 in addition to a vertical cross-section view, in a similar manner as in FIG. 8.

FIG. 16 is a view illustrating the OTP memory cell of the plan views of FIG. 14 in addition to a vertical cross-section view, in a similar manner as in FIG. 8. As shown in FIG. 16, the implant layer 380 is formed on the N+ region, but is not formed on the P+ region.

FIGS. 17A to 17D are cross-sectional views sequentially illustrating processes of a method for fabricating the OTP memory cell illustrated in FIGS. 14 and 15. Referring to FIGS. 17A to 17D, the method for fabricating the OTP memory cell 300 are described.

Figure 17A:
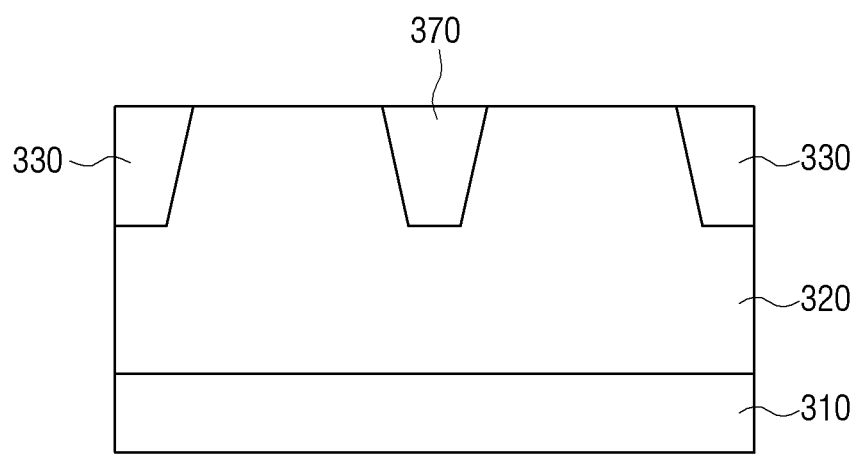
FIGS. 17A to 17D are cross-sectional views sequentially illustrating processes of an example of a method for fabricating the OTP memory cell illustrated in FIGS. 14 and 15.

Referring to FIG. 17A, the device isolation layer 330 and the intermediate isolation layer 370 are first formed on the semiconductor substrate 310, and then the well 320 is formed by injecting P-type ions onto the semiconductor substrate 310.

Figure 17B:
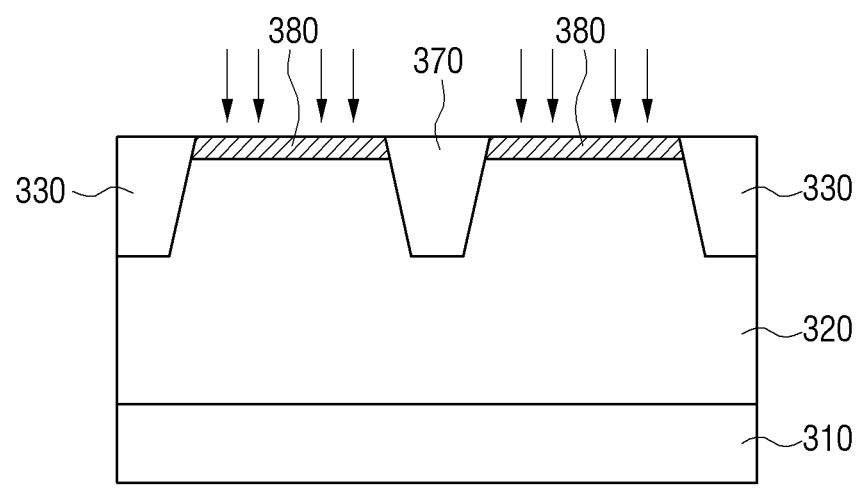

Referring to FIG. 17B, the implant layer 380 is formed by injecting N-type ions onto the surface portion of the well 320. In alternative examples, the well 320 may be formed of an N-type material, and the implant layer 380 may be formed of a P-type material.

Figure 17C:
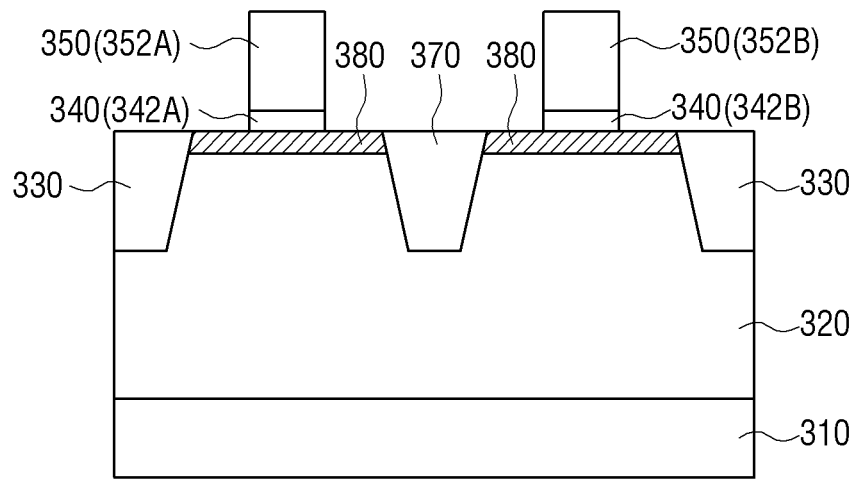

Referring to FIG. 17C, the gate insulating film 340 and the gate electrode 350 are sequentially formed on the well 320 of the semiconductor substrate 310. The gate insulating film 340 may be formed using a wet oxidation process or an oxidation process using radical ions. The gate electrode 350 may be made of any one material selected from polysilicon and metal electrode.

Figure 17D:
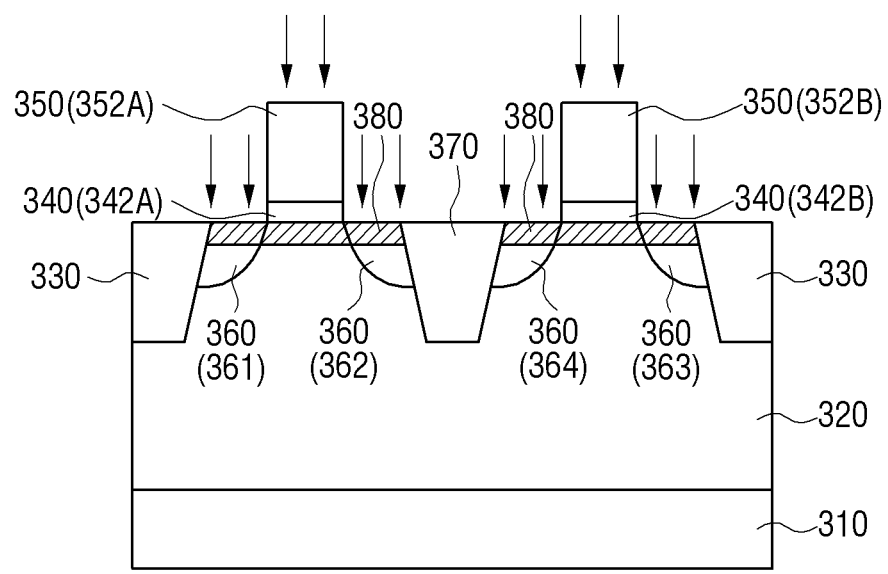

Referring to FIG. 17D, by injecting N-type ions from the upper side of the semiconductor substrate 310, the gate electrode 350 is doped with an N type, and the N-type junction region 360 is also formed on the well 320 of the semiconductor substrate 310. As described above, the junction region 360 includes the first outer junction region 361, the first inner junction region 362, the second outer junction region 363, and the second inner junction region 364. In this example, the first inner junction region 362 and the second inner junction region 364 may be arranged to be spatially separated from each other by the intermediate isolation layer 370 that has already been formed.

While the present disclosure has been shown and described with reference to certain embodiments thereof, it will be understood by those skilled in the art that various changes in form and detail may be made therein without departing from the spirit and scope of the present disclosure, as defined by the appended claims.

It is understood that the features of the present disclosure may be embodied in different forms and should not be construed as limited to the examples set forth herein. Rather, examples are provided so that this disclosure will be thorough and complete, and will convey the full scope of the present disclosure to those skilled in the art. The drawings may not be necessarily to scale, and, in some instances, proportions may have been exaggerated in order to clearly illustrate features of the examples. When a first layer is referred to as being "on" a second layer or "on" a substrate, it may not only refer to a case where the first layer is formed directly on the second layer or the substrate but may also refer to a case where a third layer exists between the first layer and the second layer or the substrate.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method for forming a one-time programmable (OTP) memory cell, the method comprising:
    forming an isolation layer in a first conductivity type well;
    forming a gate insulating layer and a gate electrode on the well,
    wherein the gate insulating layer comprises a capacitor region, a first fuse projection region, and a second fuse projection region; and
    exposing an upper portion of the well to ions of a second conductivity type to form a junction region that surrounds the first fuse projection region and the second fuse projection region,
    wherein the isolation layer is formed in the well between the first fuse projection region and the second fuse projection region.

2. The method of claim 1, wherein the forming of the isolation layer comprises forming a trench in the well and filling the trench with silicon oxide.

3. The method of claim 1, wherein the capacitor region has a greater thickness than the first fuse projection region and the second fuse projection region, and the difference in thickness of the capacitor region and the first and second fuse projection regions is obtained by depositing a gate insulating layer material of a predetermined thickness on the well and then etching the first and second fuse projection regions.

4. The method of claim 1, wherein the gate electrode is doped with ions of the second conductivity type when the junction region is formed by exposing the well to the ions of the second conductivity type.

5. The method of claim 1, further comprising forming a well tap of a first conductivity type in the well, the concentration of ions of the first conductivity type being higher in the well tap than in the well.

* * * * *